United States Patent
Sik et al.

(10) Patent No.: US 9,972,727 B2
(45) Date of Patent: May 15, 2018

(54) BISPECTRAL MATRIX SENSOR AND METHOD FOR MANUFACTURING THE SAME

(71) Applicant: Safran Electronics & Defense, Boulogne-Billancourt (FR)

(72) Inventors: Herve Sik, Boulogne-Billancourt (FR); Joel Fleury, Boulogne-Billancourt (FR); Patrice Laprat, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days. days.

(21) Appl. No.: 15/318,342

(22) PCT Filed: Jun. 12, 2015

(86) PCT No.: PCT/EP2015/063244
§ 371 (c)(1),
(2) Date: Dec. 12, 2016

(87) PCT Pub. No.: WO2015/189423
PCT Pub. Date: Dec. 17, 2015

(65) Prior Publication Data
US 2017/0125614 A1    May 4, 2017

(30) Foreign Application Priority Data

Jun. 13, 2014    (FR) ..................... 14 55449

(51) Int. Cl.
*H01L 31/02* (2006.01)
*H01L 31/0216* (2014.01)
(Continued)

(52) U.S. Cl.
CPC ........ *H01L 31/02165* (2013.01); *G02B 5/201* (2013.01); *G02B 5/281* (2013.01);
(Continued)

(58) Field of Classification Search
CPC ..... G02B 5/201; G02B 5/281; H01L 27/1462; H01L 27/14649; H01L 27/14685; H01L 31/02165
See application file for complete search history.

(56) References Cited

U.S. PATENT DOCUMENTS 9,307,120 B1 * 4/2016 Peng ................. H04N 1/60
9,523,801 B2 * 12/2016 Choi ................. G02B 5/20
(Continued)

FOREIGN PATENT DOCUMENTS

EP    0 650 199 A1    4/1995

OTHER PUBLICATIONS

International Search Report in PCT/EP2015/063244 dated Sep. 3, 2015, with English translation. 6 pages.
(Continued)

*Primary Examiner* — Francis M Legasse, Jr.
(74) *Attorney, Agent, or Firm* — Blakely Sokoloff Taylor & Zafman LLP

(57) ABSTRACT

The present invention relates to a method for manufacturing a bispectral matrix detector comprising the following steps: providing a monotype matrix detector; depositing, on the sensitive surface (3) of the monotype matrix detector, a dual-band interference filter (5) allowing the radiation in the first and second frequency bands to pass therethrough; depositing a first interference filter (4a) vertically in line with photosites (31a) intended for sensing in the first frequency band; depositing a second interference filter (4b) vertically in line with photosites (31b) intended for sensing in the second frequency band, one of the first (4a) and second (4b) interference filters being a low-pass filter cutting the second frequency band, and the other a high-pass filter cutting the first frequency band.

9 Claims, 10 Drawing Sheets

(51) Int. Cl.
*H01L 27/146* (2006.01)
*G02B 5/28* (2006.01)
*G02B 5/20* (2006.01)

(52) U.S. Cl.
CPC .... *H01L 27/1462* (2013.01); *H01L 27/14649* (2013.01); *H01L 27/14685* (2013.01)

(56) References Cited

U.S. PATENT DOCUMENTS

2009/0225204 A1   9/2009   Inaba et al.
2011/0013055 A1   1/2011   Sul et al.

OTHER PUBLICATIONS

Search Report in French Application No. 1455449 dated Apr. 24, 2015, with English translation coversheet. 3 pages.
Wallace. "IR Imaging: Imager Combines SWIR and MWIR Sensitivity." Laser Focus World, vol. 49, no. 2 (Feb. 13, 2013). 2 pages.

* cited by examiner

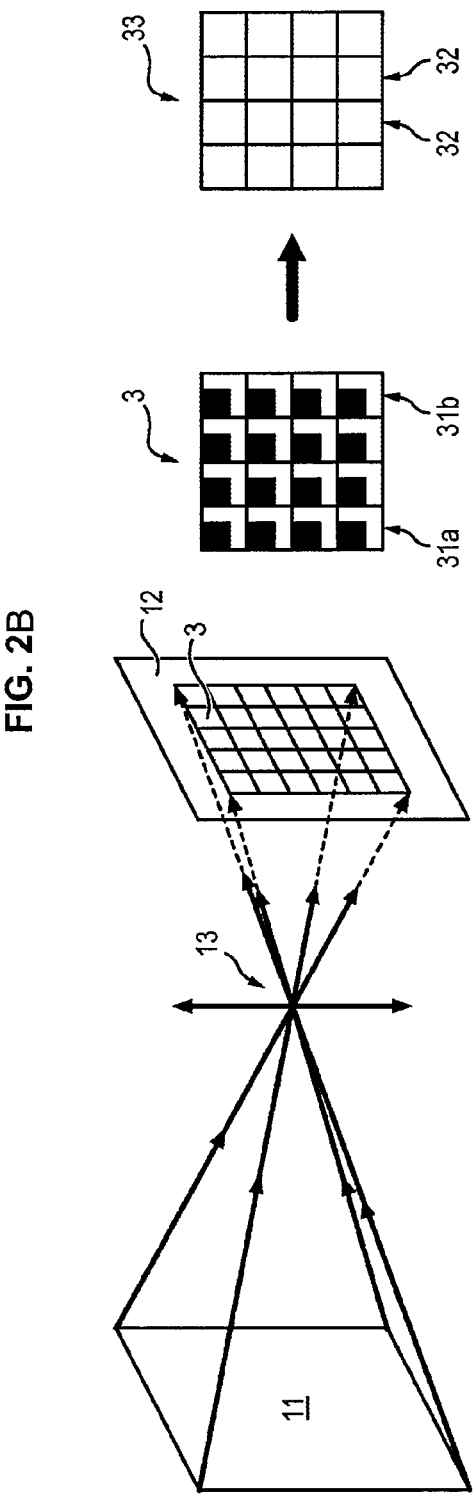

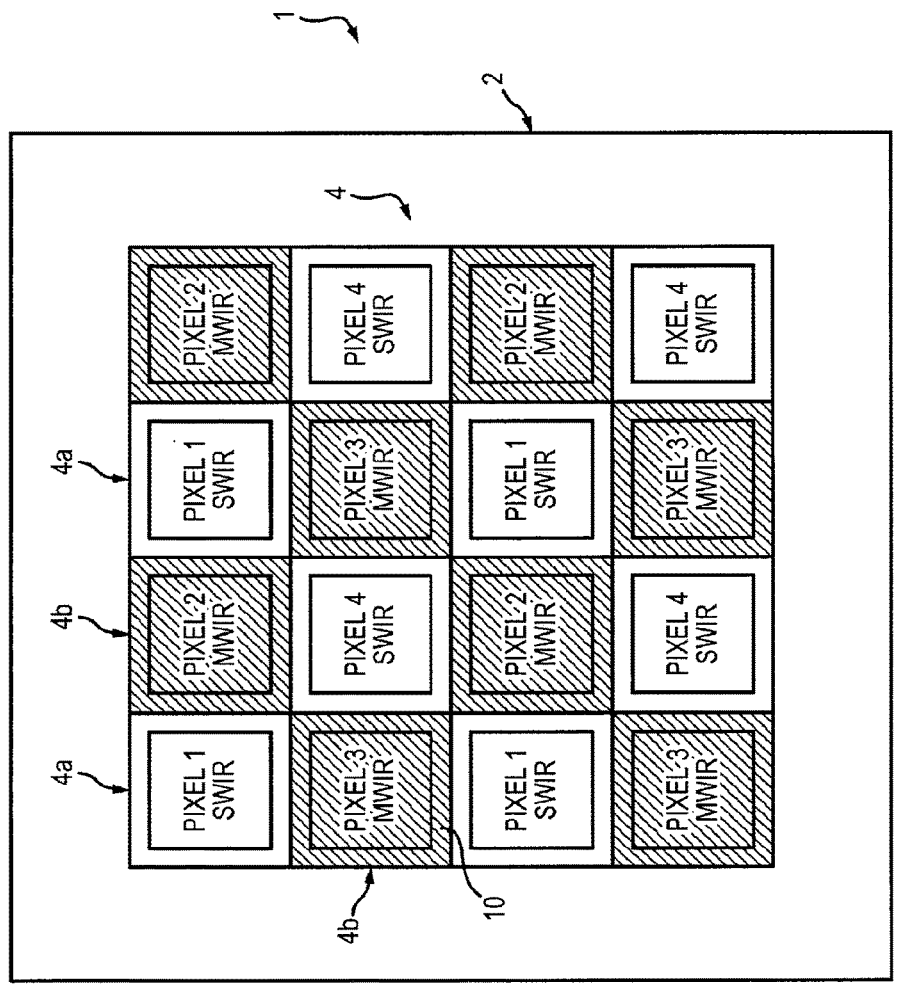

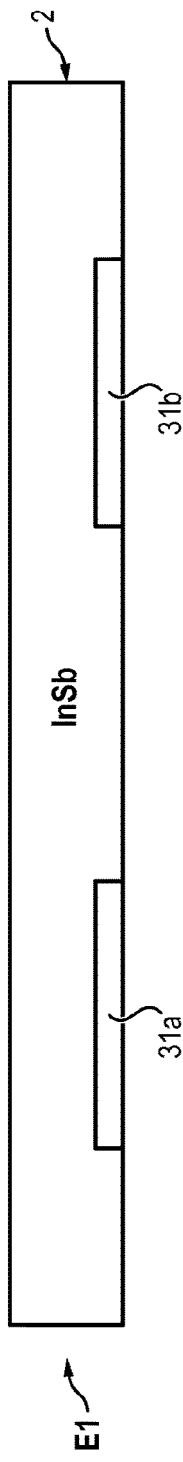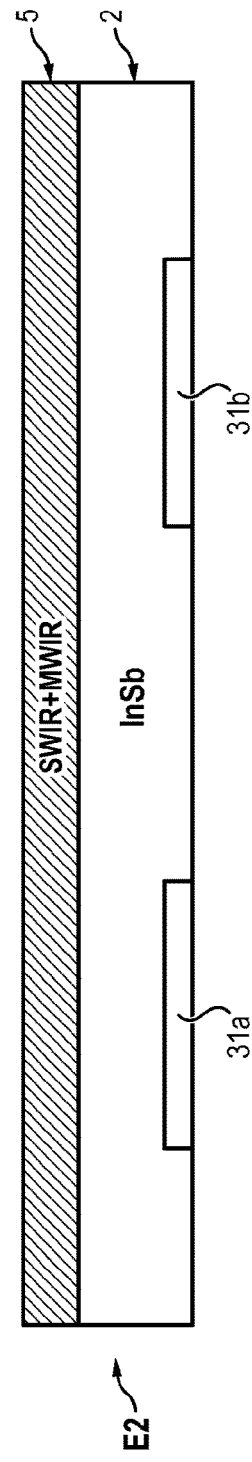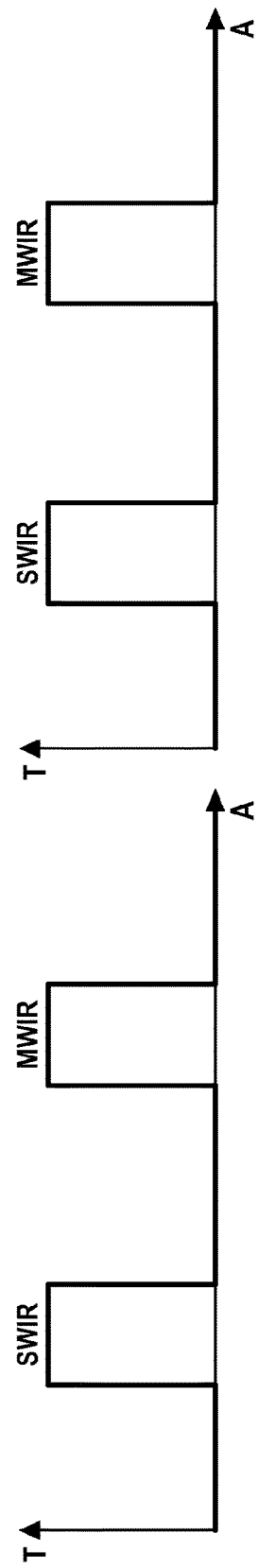

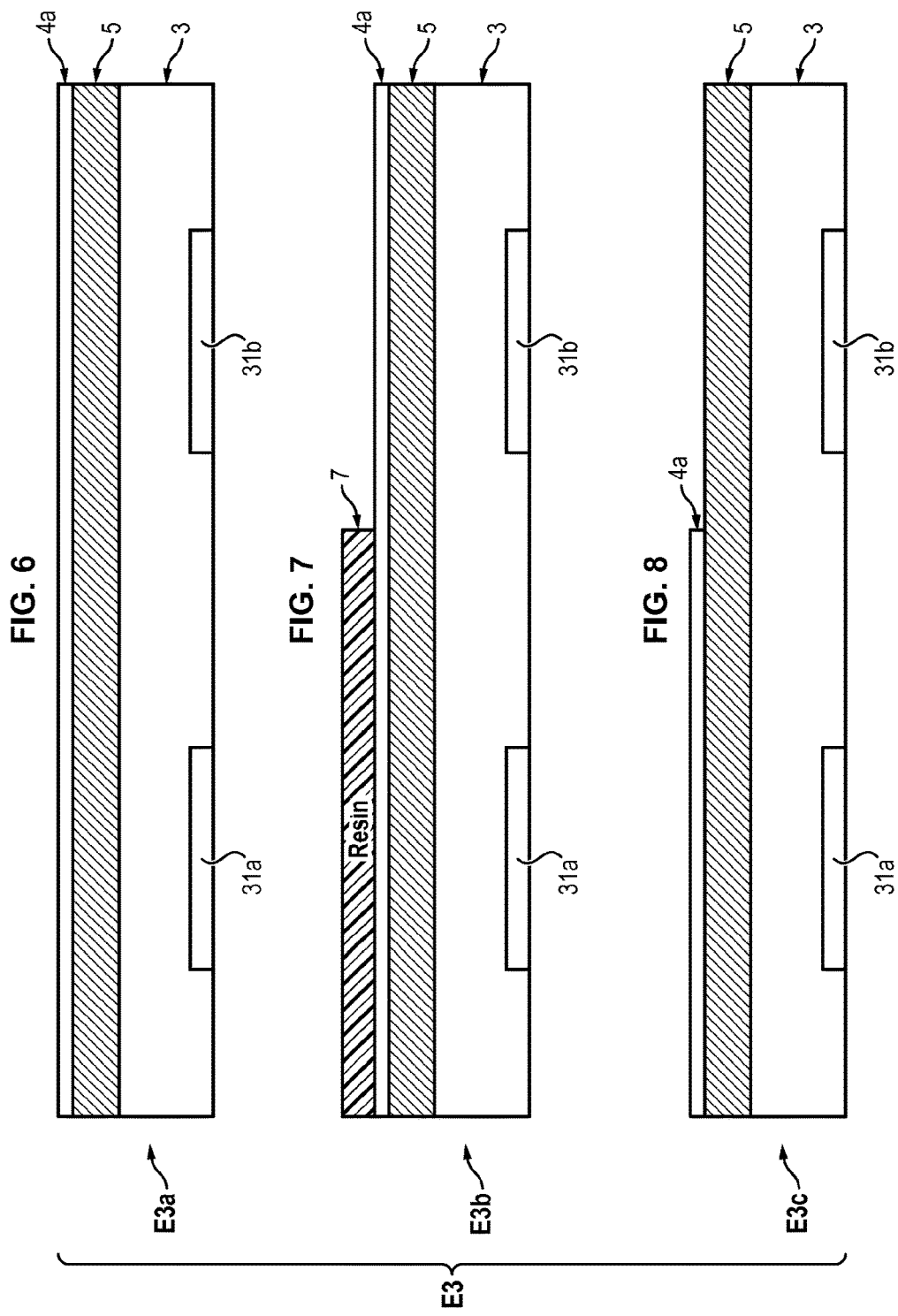

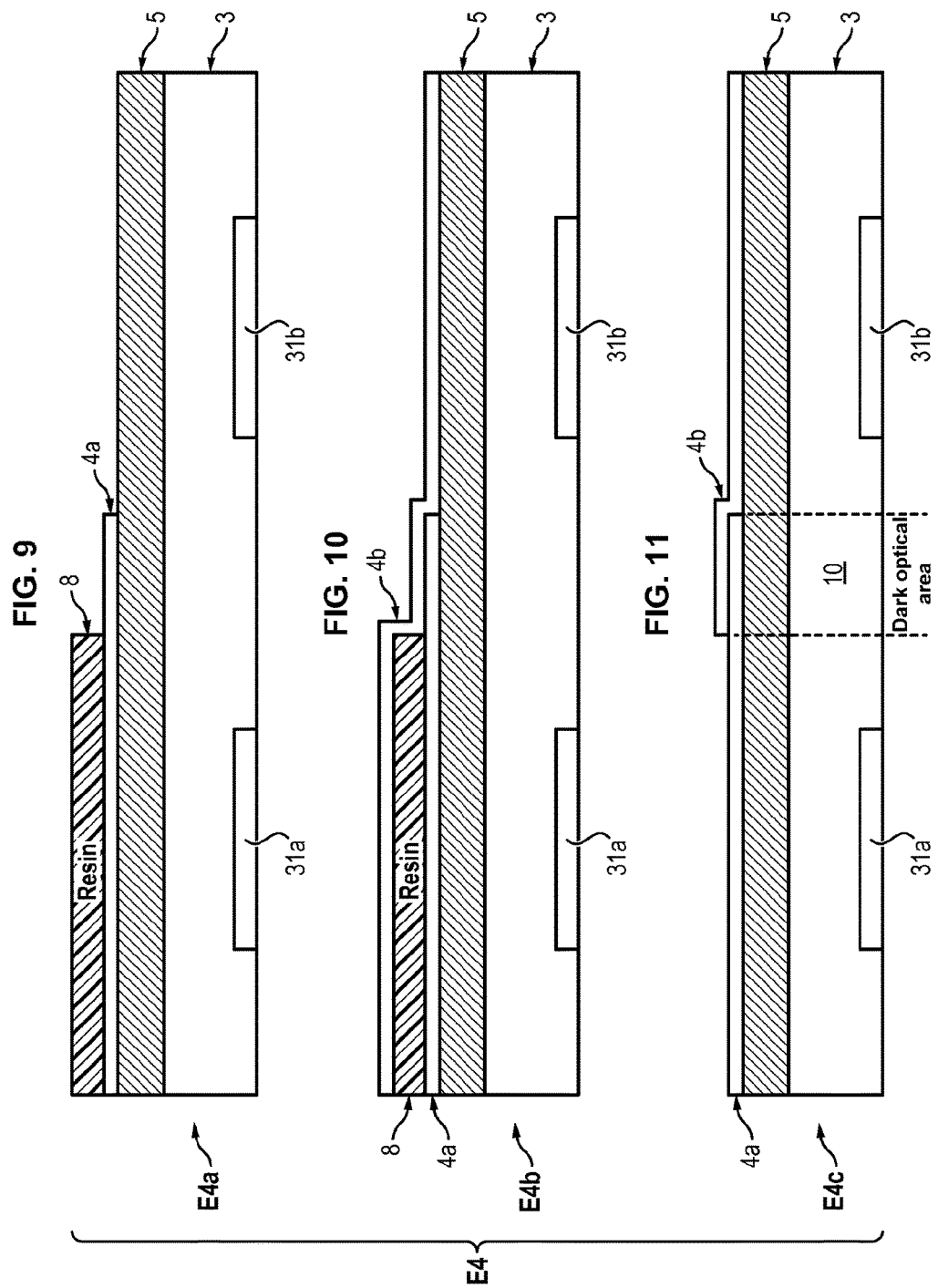

BISPECTRAL MATRIX SENSOR AND METHOD FOR MANUFACTURING THE SAME

FIELD OF THE INVENTION

The present invention relates to the field of bi-spectral array sensors and their manufacturing methods.

PRIOR ART

Combustion in the atmosphere causes a spectrum having a certain number of distinctive characteristics and especially peaks between on the one hand 1.9 and 2 micrometers and on the other hand between 3.5 and 4.2 micrometers and between 4.55 and 4.8 micrometers.

This property is advantageously used to detect gunfire, which produces emissions whereof the ratio between the intensities in the two spectral bands is characteristic. To do this, it is necessary to be able to detect radiation in these two spectral bands in real time simultaneously and with very good spatial resolution and major sensibility.

Two partially or completely different spectral channels can be used, but such systems are expensive and bulky. Also, the performances of systems operating on this principle are mainly based on the stability, as a function of the different operational conditions, of the signal levels in the relevant spectral bands and their respective ratios. Systems offering very few differences between the spectral channels must therefore be used and a maximum of common elements therefore must be found.

It has therefore been proposed to use a monotype array sensor in front of which is placed a filter array consisting of a checkerboard of filters of two different types respectively letting radiation pass in a first frequency band and in a second frequency band. The filter array assigns half the photosites to detection in a first frequency band and the other half of the photosites to detection in a second frequency band, in this way detecting radiation in two different frequency bands on a single monotype array sensor.

To this end, it has been proposed to use a array of interference filters. An interference filter is a filter obtained by thin-film deposition of various materials on a substrate. These layers produce constructive interferences in certain wavelengths and destructive interferences in certain other wavelengths. According to the complexity of the filter, it will be possible to let through or cut off one or more spectral bands.

Now, it is impossible to create, by thin-film deposition, a filter array respectively passing through a first band of frequency and a second band of frequency to the size of the pixel. In fact, the stacks of thin films constituting such a filter array have thicknesses of the order of magnitude of the size of the photosite of the array detector. A filter array made this way would have large diffraction surfaces which would considerably degrade the contrast and optical resolution of the detector.

To counter the problem, it has especially been proposed to produce detectors with stacks of absorbent multilayers by molecular epitaxy or in gaseous phase. The drawback to epitaxy technologies is that they are costly.

It has also been proposed to produce filters on substrate transferred to the sensitive surface of the detector. These filters present many drawbacks. The distance between the filter and the active surface generates a diffraction phenomenon the consequence of which is loss of optical resolution and low fill factor.

DISCLOSURE OF THE INVENTION

The invention rectifies at least one of the above drawbacks by proposing a method for manufacturing a bispectral detector by thin-film deposition.

For this purpose, the invention proposes a method for manufacturing a bispectral array detector characterized in that it includes the following steps;
providing a monotype array detector comprising a sensitive surface composed of alternating photosites intended to sense in a first frequency band and photosites intended to sense in a second frequency band,
depositing over the entire sensitive surface an dual-band interference filter letting through radiation in the first and the second frequency band on the sensitive surface;
depositing a first interference filter directly above the photosites intended to sense in the first frequency band;
depositing a second interference filter directly above the photosites intended to sense in the second frequency band,
one of the interference filters from the first and the second interference filter being a low-pass filter cutting off the second frequency band of the dual-band filter and the other a high-pass filter cutting the first frequency band of the dual-band filter.

The invention has multiple advantages.

Superimposition of a dual-band filter and a filter array respectively low-pass and high-pass, being equivalent to a dual-band filter array, the invention produces a bispectral array detector by thin-film deposition.

The invention further minimizes the loss of fill factor and maximizes the optical resolution of the detector.

The invention enables manufacture of filters having sizes of the photosites of the focal plane array detectors (FPA), i.e., of the order of 10 µm.

The invention has the advantage of being compact with respect to a filter transferred to the sensitive surface of the detector, since in the invention the filter array is directly deposited onto the sensitive surface of the detector.

The invention is advantageously completed by the following characteristics, taken individually or in any of their technically possible combinations:
the first interference filter and the second interference filter are deposited on the dual-band interference filter;
the first interference filter and the second interference filter are deposited directly on the dual-band interference filter (directly means that there is no intermediate layer between the first interference filter and the dual-band interference filter or between the second interference filter and the dual-band interference filter);
the deposition of the first interference filter directly above the photosites intended to sense in the first frequency band includes the following steps;
deposition of the first interference filter over the entire sensitive surface of the monotype array detector;
deposition of a protective layer on the parts of the first interference filter directly above the photosites intended to sense in the first frequency band;
etching of the parts of the first interference filter not protected by the protective layer;
the protective layer is deposited by photolithography;

the manufacturing method further comprises a step prior to deposition of the first interference filter, and consisting of depositing a buffer layer;

the manufacturing method further comprises a step prior to deposition of the first interference filter, and consisting of depositing a stopping layer;

the deposition of the second interference filter directly above the photosites intended to sense in the second frequency band, includes steps of:

deposition of a sacrificial layer directly above the photosites intended to sense in the first frequency band;

deposition of the second interference filter over the entire sensitive surface;

removal of the sacrificial layer;

the removal of the sacrificial layer is done by chemical washing;

the removal of the sacrificial layer is done by mechanical stress;

the deposition of the interference filters consists of depositing superimposition of layers of ZnS, $SiO_2$ and Ge.

a first interference filter deposited on the dual-band interference filter directly above the photosites intended to sense in the first frequency band a second interference filter deposited on the dual-band interference filter directly above the photosites intended to sense in the second frequency band;

one of the interference filters from the first and the second interference filter being a low-pass filter cutting the second frequency band of the dual-band filter and the other a high-pass filter cutting the first frequency band of the dual-band filter.

The invention also relates to a bispectral array detector including:

a sensitive surface composed of alternating photosites intended to sense in a first frequency band and photosites intended to sense in a second frequency band, an dual-band interference filter letting through radiation in the first and the second frequency band deposited on the sensitive surface;

DESCRIPTION OF THE FIGURES

Other aims, characteristics and advantages will emerge from the following detailed description in reference to the drawings given by way of illustration and non-limiting, in which:

FIG. 2B illustrates a monotype array detector according to the invention;

FIG. 2C illustrates a bispectral filter array according to the invention;

FIG. 3 illustrates a step for providing a sensitive surface of a detector;

FIG. 4 illustrates a step for depositing an dual-band interference filter;

FIG. 5 illustrates the transmittance profile of the dual-band interference filter;

FIG. 6 illustrates a step for depositing a first interference filter;

FIG. 7 illustrates a step for depositing a protective layer on the part of the surface directly above the photosites intended to sense in a first frequency band;

FIG. 8 illustrates a step for removing parts of the first interference filter not protected by the protective layer;

FIG. 9 illustrates a step for depositing a sacrificial layer on the part of the surface directly above the photosites intended to sense in a second frequency band;

FIG. 10 illustrates a step for depositing a second filter;

FIG. 11 illustrates a step for removing the sacrificial layer;

DETAILED DESCRIPTION OF THE INVENTION

Figure 1:
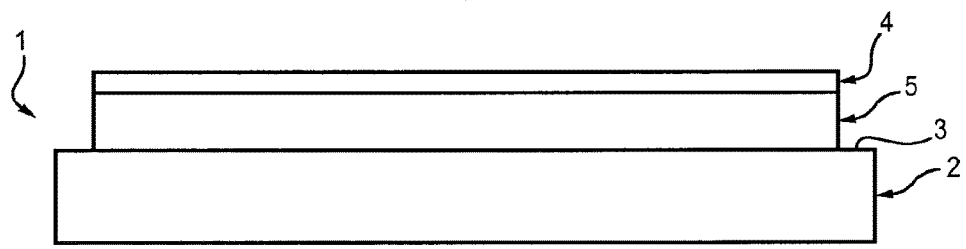
FIG. 1 illustrates a bispectral array detector according to the invention.

In reference to FIG. 1, a bispectral array detector 1 comprises a monotype array detector 2 comprising a sensitive surface 3 or 'array' on which a dual-band filter 5 and a filter array 4 constituted by alternating high-pass and low-pass filters have been successively deposited.

Figure 2A:
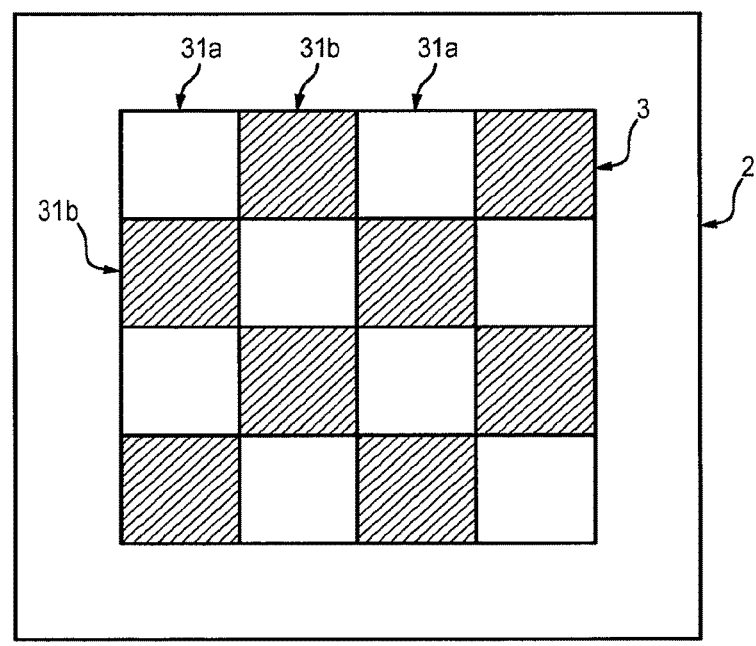
FIG. 2A illustrates the sensitive surface of a monotype array detector.

In reference to FIG. 2, the sensitive surface 3 of the monotype array detector 2 is composed of an alignment of photosites 31a and 31b arranged in rows and columns.

In reference to FIG. 2bis, the monotype array detector 2 is typically a focal plane array detector (FPA), i.e., its sensitive surface 3 is composed of enough photosites 31a and 31b to avoid mechanical or optical scanning for preferred spatial resolution. An image 33 of the scene 11 forms in the focal plane 12 of the lens 13 focused at infinity. The sensitive surface 3 is placed in the focal plane 12, giving rise to the name FPA array. The monotype array detector 2 typically operates in the infrared and therefore images a thermal scene 11.

A photosite 31a and 31b is an elementary compound of the surface of an image sensor, which captures the luminosity of a pixel 32 of the image 33. There is a one and only single photosite for each pixel 32 of the image. The columns and rows of these photosites 31a and 31b make up the sensitive surface 3 of the monotype array detector 2. Each photosite 31a and 31b comprises a photodetector. The photodetectors operate by absorption of infrared photons and photogeneration of charge carriers (photovoltaic or photoconductor effect) creating excess current in the (photocurrent) material. The photodetectors are for example PN photodiodes (mainly made of mercury-cadmium-tellurium—HgCdTe), or PIN photodiodes with heterojunction of type II, (of indium antimonide (InSb)). The relationship between the total surface of the photosite 31a and 31b and the surface of the photodetector is called fill factor.

The monotype array detector 2 is monotype in the sense that all of its photosites 31a and 31b are sensitive to the same wavelength range.

Even though all photosites 31a and 31b are sensitive to the same wavelength range, some of them are assigned to detection in a first frequency band and the rest are assigned to detection in a second frequency band in such a way that the array detector 1 detects radiation in these two frequency bands. The wavelength range to which the photosites 31a and 31b are sensitive comprises the first and the second frequency band. In reference to FIG. 2, the sensitive surface 3 is composed of an alternation (or checkerboard pattern) of photosites 31a intended to sense in a first frequency band and of photosites 31b intended to sense in a second frequency band.

In the exemplary embodiment described, the first frequency band corresponds to radiation having a wavelength of between 3 and 6 micrometers corresponding to the band of wavelengths called 'medium wavelength infrared' (MWIR) while the second frequency band corresponds to radiation having a wavelength of between 0.75 and 3 micrometers corresponding to the band of wavelengths called 'short wavelength infrared' (SWIR).

In reference to FIG. 5, the dual-band filter 5 lets through radiation in the first and the second frequency band only, while the dual-band filter 5 is therefore a filter SWIR+MWIR.

In reference to FIG. 2ter, the filter array 4 is a juxtaposition of interference filters 4a and 4b low-pass and high-pass respectively.

The method for manufacturing a bispectral array detector 1 comprises the following steps;
  E1 providing a monotype array detector 2 comprising a sensitive surface 3 composed of alternating photosites 31a intended to sense in a first frequency band and photosites 31b intended to sense in a second frequency band (see FIG. 3),
  E2 deposition of an dual-band interference filter 5 letting through radiation in the first and the second frequency band on the sensitive surface 3 (see FIG. 4);
  E3 deposition of a first interference filter 4a directly above the photosites 31a intended to sense in the first frequency band (see FIGS. 6, 7 and 8);
  E4 deposition of a second interference filter 4b directly above the photosites 31a intended to sense in the second frequency band (see FIGS. 9, 10 and 11).

The first interference filter 4a and the second interference filter 4b are deposited on the dual-band interference filter 5, respectively directly above the photosites 31a intended to sense in the first frequency band and directly above the photosites 31a intended to sense in the second frequency band.

The first interference filter 4a and the second interference filter 4b can especially be deposited directly on the dual-band interference filter 5 (directly means that there is no intermediate layer between the first interference filter and the dual-band interference filter or between the second interference filter and the dual-band interference filter).

The first interference filter 4a and the second interference filter 4b can also be deposited on a stopping layer 6 deposited on the dual-band interference filter 5.

One of the interference filters 4a, 4b from the first 4a and the second 4b interference filter is a low-pass filter and the other a high-pass filter. In the embodiment described below the first interference filter 4a is low-pass and the second 4b is high-pass, but it is of course possible that the first interference filter 4a is high-pass and the second 4b low-pass.

The interference filters 4a, 4b and 5 are constructed by stacking layers of materials of different refraction indices. These layers produce constructive interferences in certain wavelengths and destructive interferences in certain wavelengths, in such a way that only radiations at selected wavelengths are transmitted, the other radiation being reflected. According to the complexity of the filter, it will be possible to let through or cut off one or more spectral bands. The interference filters 4a, 4b and 5 are typically composed of alternating superimposition of layers of ZnS, $SiO_2$ and Ge. Deposition of this succession of layers is typically done by evaporation or cathodic sputtering.

Deposition E3 of the first interference filter 4a directly above the photosites 31a intended to sense in the first frequency band comprises the following steps:
  E3a deposition of the first interference filter 4a over the entire sensitive surface 3 of the monotype array detector 2 (see FIG. 6);
  E3b deposition of a protective layer 7 on the parts of the first interference filter 4a directly above the photosites 31a intended to sense in the first frequency band (see FIG. 7);
  E3c etching of regions of the first interference filter 4a not protected by the protective layer 7 (see FIG. 8).

The protective layer 7 is for example a photosensitive resin deposited by using photolithography techniques. The steps of the photolithography method begin with application of the protective layer 7 in the form of a thin film over the entire surface of the first filter 4a. This is then exposed to irradiation. During this step, use of a mask, formed from opaque and transparent areas, defines the pattern to be reproduced on the protective layer 7. The exposure creates reactions within the resin and engenders chemical modifications; the irradiated areas will see their solubility evolve according to the type of resin—positive or negative. The specific solvents contained in the developer will remove the resin exposed or not according to its solubility.

The photosensitive resin composing the protective layer 7 must be both sensitive to irradiation, to ensure faithful and precise reproduction of the image of the mask, and also to effectively protect the substrate during etching, which involves some resistance to agents used for the etching as well as sufficient thickness. A protective layer 7 of 3 micrometers in thickness constituted by a positive resin is typically used.

The etching E3c can be ionic etching, plasma etching, and/or chemical etching. In the case of ionic etching, the sufficiently thick resin will block, where it is present, implantation of ions in the substrate. The etching step E3c removes the first filter 4a in all regions not covered by the protective layer 7, and the patterns of the protective layer 7 will be reproduced on the first filter 4a.

Figure 13:
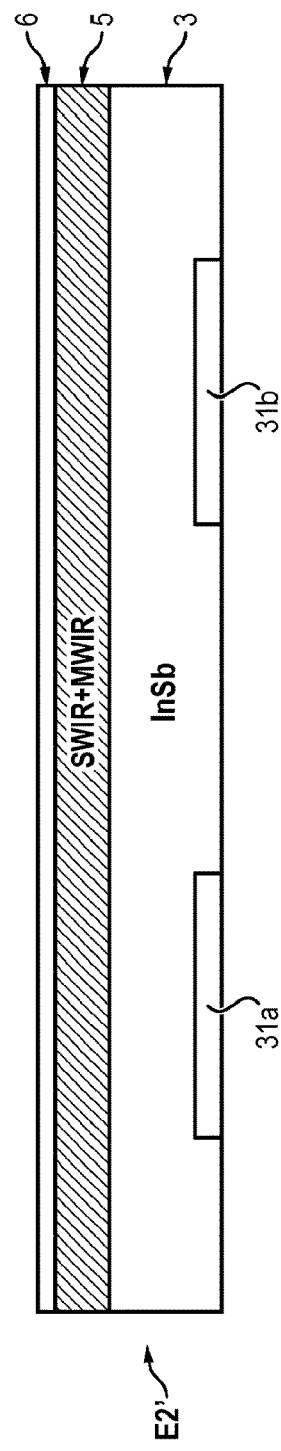
FIG. 13 illustrates a step for depositing a stopping layer.

In the event where the etching is chemical or plasma etching, and in reference to FIG. 13, the manufacturing method comprises a step E2' prior to deposition of the first filter 4a, and consisting of depositing a stopping layer 6. The stopping layer 6 is made of optically neutral material, i.e., having a refraction index close to 1 typically between 1 and 1.5 and resisting the etching of step E3c, such as for example $SiO_2$ or MgF2. In the case of material such as $YF_3$ its higher index means depositing a thinner layer.

Figure 14:
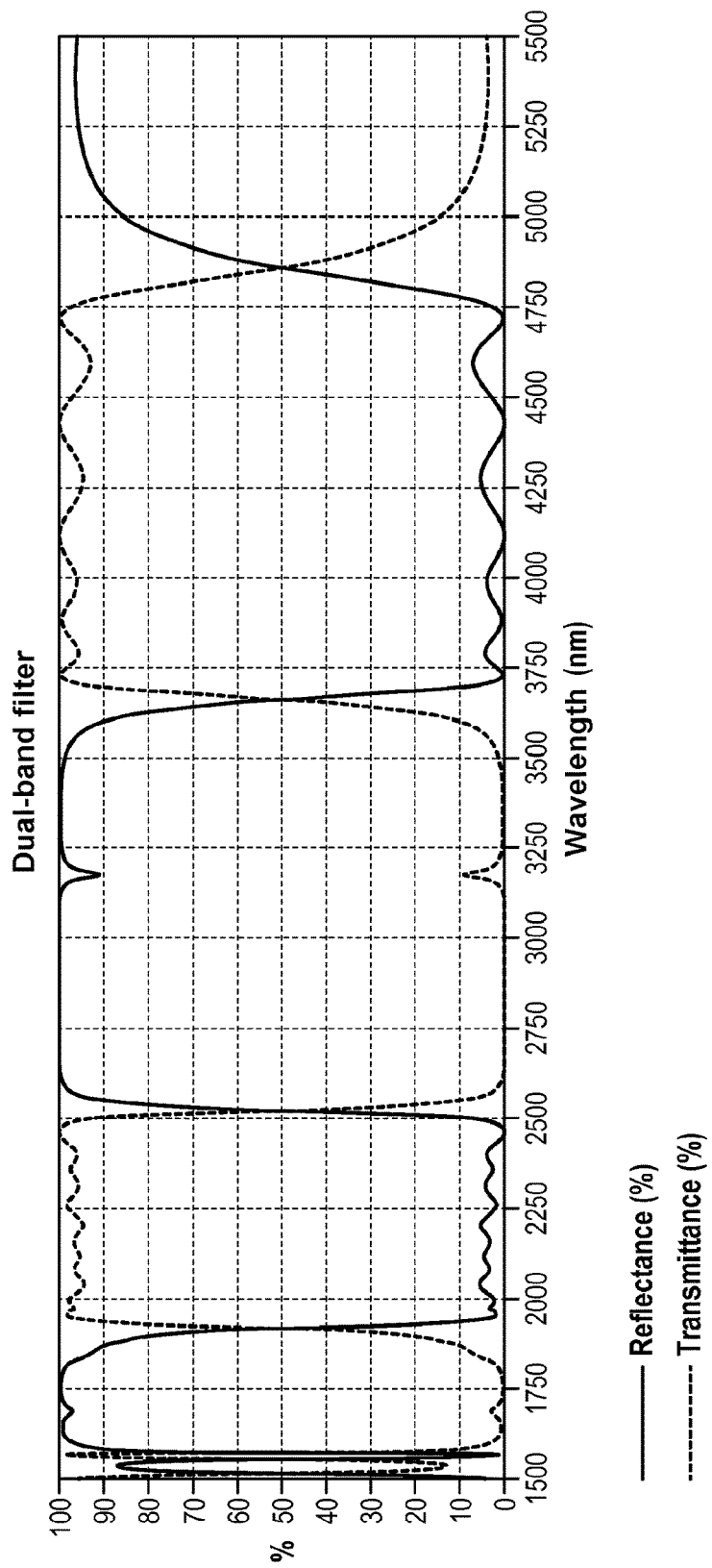
FIG. 14 illustrates the transmittance and reflectance of an example of dual-band filter.

In the event where the etching is etching by ionic etching, and in reference to FIG. 14, the manufacturing method can further comprise a step E2' prior to deposition of the first filter 4a, and consisting of depositing a stopping layer 6. The stopping layer 6 is intended to ensure integrity of the wide-band filter during the etching of step E3c. The stopping layer 6 is typically made of SiO2 or MgF2. The thickness of the stopping layer 6 is selected in such a way that the ionic etching does not attack the wide-band filter 5. A stopping layer 6 of 0.25 micrometer in thickness made of SiO2 is used, for instance. In the case of a stopping layer made of yttrium(III) oxide (Y2O3), the thickness would be of the order of 0.12 micrometer.

On completion of the etching of step E3c, the resin is removed by using a solvent such as for example acetone.

Deposition E4 of the second interference filter 4b directly above the photosites 31b intended to sense in the second frequency band comprises steps of:
- E4a deposition of a sacrificial layer 8 directly above the photosites 31a intended to sense in the first frequency band (see FIG. 9);
- E4b deposition of the second interference filter 4b over the entire sensitive surface 3 (see FIG. 10);
- E4c removal of the sacrificial layer 8 (see FIG. 11).

Various methods can be used to deposit the sacrificial layer 8, especially ultraviolet lithography or electron beam lithography. For this purpose, the sacrificial layer 8 is deposited over the entire surface of the substrate, then etched in reverse pattern (in this case etching of the sacrificial layer directly above the photosites 31b intended to sense in the second frequency band).

In reference to FIG. 10, during step E4b the second filter 4b is then deposited all over the substrate (in this case the dual-band filter 5) in the etched regions and on the sacrificial layer 8 in the regions where it has not been previously etched.

In reference to FIG. 11, step E4c of removing the sacrificial layer 8 is typically done by washing (photosensitive resin in a solvent), irradiation, by mechanical stress or vibrations. The material deposited on the sacrificial layer 8 is removed with the sacrificial layer 8, while the material deposited directly on the substrate is not removed. The second filter 4b stays consequently only in the regions where it was in direct contact with the substrate (in this case the dual-band filter 5).

Figure 12:
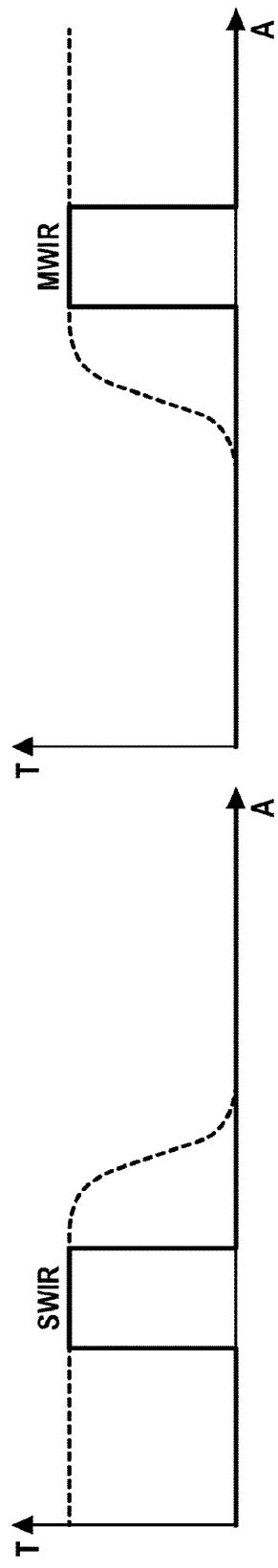
FIG. 12 illustrates to the left the transmittance profile of the dual-band interference filter superimposed on the first filter, and to the right the transmittance profile of the dual-band interference filter superimposed on the second filter.

In reference to FIG. 12, the low-pass filter 4a cuts the second frequency band of the dual-band filter 5, while the high-pass filter 4b cuts the first frequency band of the dual-band filter 5. Superimposition of the dual-band filter 5 and of the low-pass filter 4a is therefore equivalent to a bandpass filter letting through the first frequency band, while superimposition of the dual-band filter 5 and the high-pass filter 4b is equivalent to a bandpass filter letting through the second frequency band. Consequently, superimposition of a dual-band filter 5 over the entire sensitive surface 3 and of the low-pass 4a and high-pass 4b filter arrays respectively is equivalent to a filter array passing in a first frequency band and in a second frequency band respectively.

FIG. 14 shows the transmittance and reflectance of an example of dual-band filter SWIR+MWIR 5 constituted by thirty layers, the dual-band filter SWIR+MWIR 5 having total thickness of around 10 micrometers. As shown by FIG. 14, producing a highly selective filter (and especially a dual-band filter with narrow transmission band such as the dual-band filter SWIR+MWIR 5) needs superimposition of many layers. A very selective filter is therefore consequently and necessarily thick, the consequence of which is making it impossible to produce, by thin-film deposition, a filter array respectively passing in a first frequency band and in a second frequency band at the size of a pixel.

Figure 15:
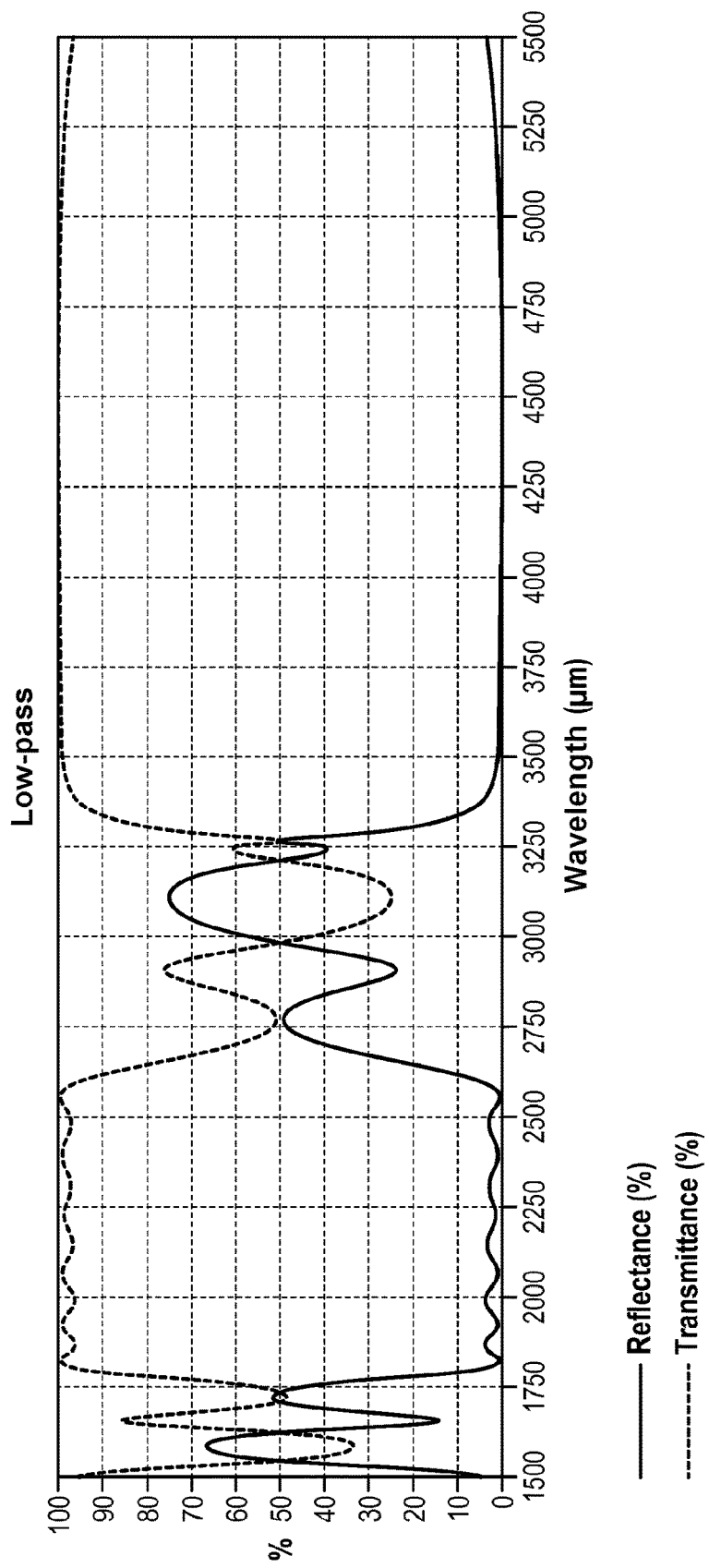
FIG. 15 illustrates the transmittance and reflectance of an example of low-pass filter.
Figure 16:
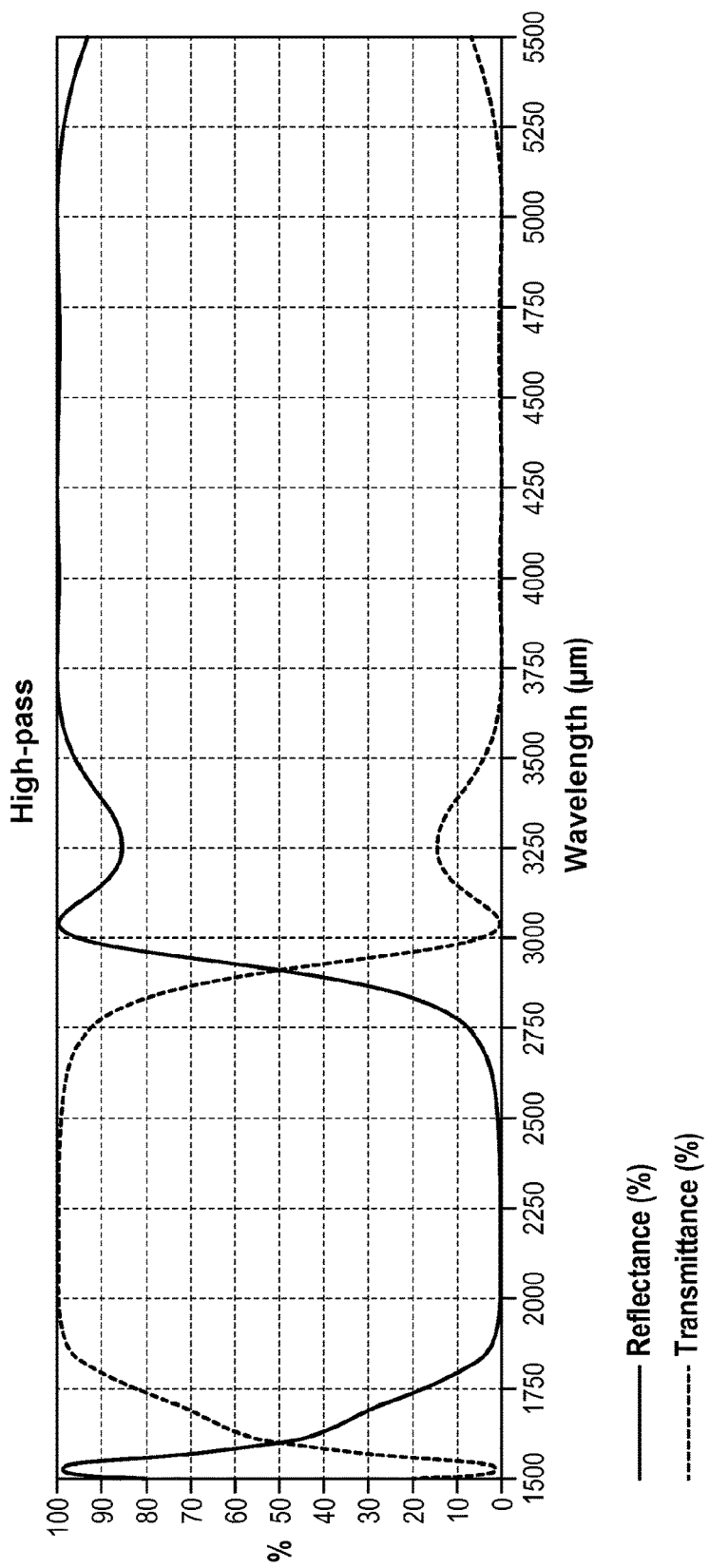
FIG. 16 illustrates the transmittance and reflectance of an example of high-pass filter.

FIG. 15 shows the transmittance and reflectance of an example of low-pass filter constituted by a dozen layers whereof the total thickness is around 4 micrometers. FIG. 16 shows the transmittance and reflectance of an example of high-pass filter constituted by a dozen layers whereof the total thickness is around 5 micrometers. As shown by FIGS. 15 and 16, producing a minimally selective filter (and especially a high-pass 4b or low-pass 4a filter) needs superimposition of fewer layers. It is consequently possible to produce, by thin-film deposition, a respectively low-pass and high-pass filter array at very low orders of magnitude and especially at the size of a pixel.

In reference to FIG. 11, the overlap area 10 between the two filters 4a and 4b corresponds to the area between the photosites 31a and 31b. This overlap area 10 is absorbent and can be either reduced (typically down to 1 μm) to maximize the fill factor of the photosites, or amplified (typically up to 10 μm) to minimize cross-talk between the photosites.

The invention claimed is:

1. A method for manufacturing a bispectral array detector, wherein it includes the following steps;
providing a monotype array detector comprising a sensitive surface composed of alternating photosites intended to sense in a first frequency band and photosites intended to sense in a second frequency band,
deposition, on the sensitive surface, of an dual-band interference filter letting through radiation in the first and the second frequency band the monotype array detector being monotype in the sense that all of its photosites are sensitive to the same wavelength range;
deposition of a first interference filter directly above the photosites intended to sense in the first frequency band;
deposition of a second interference filter directly above the photosites intended to sense in the second frequency band,
one of the interference filters from the first and the second interference filter being a low-pass filter cutting the second frequency band, and the other a high-pass filter cutting the first frequency band, wherein the first interference filter and the second interference filter are deposited on the dual-band interference filter.

2. The method for manufacturing a bispectral array detector according to claim 1, the step for depositing a first interference filter including an etching step, the manufacturing method further including a step prior to deposition of the first filter, and consisting of depositing a stopping layer, the thickness and the material of the stopping layer being selected in such a way that the etching does not attack the dual-band interference filter.

3. The method for manufacturing a bispectral array detector according to claim 1, deposition of the first interference filter directly above the photosites intended to sense in the first frequency band including the following steps:
deposition of the first interference filter over the entire sensitive surface of the monotype array detector;
deposition of a protective layer on the parts of the first interference filter directly above the photosites intended to sense in the first frequency band;
etching of the parts of the first interference filter not protected by the protective layer.

4. The method for manufacturing a bispectral array detector according to claim 3, the protective layer is deposited by photolithography.

5. The method for manufacturing a bispectral array detector according to claim 1, the deposition of the second interference filter directly above the photosites intended to sense in the second frequency band, including steps of:
deposition of a sacrificial layer directly above the photosites intended to sense in the first frequency band;
deposition of the second interference filter over the entire sensitive surface;
removal of the sacrificial layer.

6. The method for manufacturing a bispectral array detector according to claim 5, removal of the sacrificial layer being done by chemical washing.

7. The method for manufacturing a bispectral array detector according to claim 5, removal of the sacrificial layer being done by mechanical stress.

8. The method for manufacturing a bispectral array detector according to claim 1, deposition of the interference filters consisting of depositing superimposition of layers of ZnS, SiO$_2$ and Ge.

9. A bispectral array detector including:
- a sensitive surface composed of alternating photosites intended to sense in a first frequency band and photosites intended to sense in a second frequency band, the monotype array detector being monotype in the sense that all of its photosites are sensitive to the same wavelength range;
- a dual-band interference filter letting through radiation in the first and the second frequency band deposited on the sensitive surface;
- a first interference filter deposited on the dual-band interference filter directly above the photosites intended to sense in the first frequency band
- a second interference filter deposited on the dual-band interference filter (5) directly above the photosites intended to sense in the first frequency band;
- one of the interference filters from the first and the second interference filter being a low-pass filter cutting the second frequency band, and the other a high-pass filter cutting the first frequency band, wherein the first interference filter and the second interference filter are deposited on the dual-band interference filter.

* * * * *